United States Patent [19]

Wolf et al.

[11] 4,182,982
[45] Jan. 8, 1980

[54] CURRENT SENSING TRANSDUCER FOR POWER LINE CURRENT MEASUREMENTS

[75] Inventors: Joachim E. Wolf; Philip F. Locke, Jr., both of Monroeville, Pa.

[73] Assignee: Westinghouse Electric Corp., Pittsburgh, Pa.

[21] Appl. No.: 923,620

[22] Filed: Jul. 11, 1978

[51] Int. Cl.$^2$ .................. G01R 1/20; G01R 19/00
[52] U.S. Cl. .................................. 324/127; 323/6; 324/126
[58] Field of Search .............. 324/127, 126, 142; 323/6

[56] References Cited

U.S. PATENT DOCUMENTS

| 2,428,613 | 10/1947 | Boyajian | 307/83 |
| 3,343,084 | 9/1967 | Gambale et al. | 324/103 R |
| 3,372,334 | 3/1968 | Fenoglio et al. | 324/127 |
| 3,539,908 | 11/1970 | Zelina | 324/117 R |
| 3,764,908 | 10/1973 | Elms | 324/142 |
| 3,864,631 | 2/1975 | Zitelli | 324/115 |
| 3,916,310 | 10/1975 | Stark et al. | 324/127 |
| 4,077,061 | 2/1978 | Johnston et al. | 324/76 R |

FOREIGN PATENT DOCUMENTS 227910 1/1925 United Kingdom .

Primary Examiner—Rudolph V. Rolinec
Assistant Examiner—Ernest F. Karlsen
Attorney, Agent, or Firm—R. W. Smith

[57] ABSTRACT

A current sensing transducer includes a conductive current divider including a branch path for conducting a fractional current proportional to a current to be sensed and being applied through the divider. A compensated transformer includes a primary circuit responsive to the fractional current and two secondary windings. An amplifier circuit controls the current input to one secondary winding in response to the output of the other secondary winding so that the flux of the primary circuit is virtually compensated in the core and the secondary winding current is a measure of the current to be sensed.

4 Claims, 5 Drawing Figures

CURRENT SENSING TRANSDUCER FOR POWER LINE CURRENT MEASUREMENTS

BACKGROUND OF THE INVENTION

1. Field of the Invention

This invention relates to transducers for sensing power line voltage and current components of alternating current electric energy, and more particularly to such transducers for sensing the line currents and producing corresponding analog signals for use by measuring circuits indicating current or electrical energy parameters of AC electric energy usage.

2. Description of the Prior Art

Current measurements are required for various reasons in AC electric power distribution. Both current responsive and voltage responsive transducers are required in the extensively required power line measurements of electric energy required for billing purposes. Induction watthour metering devices for alternating current electric energy measurement are almost exclusively used by producers of electric energy for measuring consumption by separate energy users. Typically, watthour meters are used for indicating consumption in kilowatt-hours. The watthour meters are usually of the electromagnetic induction type having voltage and current coils and a rotating disc driven by fluxes from the two coils. These induction type watthour meters are recognized as having high degrees of reliability and accuracy, being available at reasonable cost, and being capable of operation in widely varying extremes of temperature and other environmental conditions while providing highly accurate and reliable operation.

It is also known to measure alternating current electric energy quantities such as kilowatt-hours, volt-ampere hours, reactive volt-ampere hours, with electronic measuring circuits. These measuring circuits require the voltage and current components of an electric energy quantity to be measured to be sensed by electrical transducers. Voltage and current responsive analog signals are produced at the outputs of the transducers at low level signal magnitudes. Preferably, the analog signals are isolated from the higher magnitudes of the sensed power line voltages and currents, and the analog signals are required to be compatible with the low level signal limitations of electronic measuring circuits. it is known to utilize potential and current instrument transformers to provide analog signals proportional to the voltage and current components of the electric energy to be measured.

Various types of known electronic energy measuring circuits are adapted to receive the voltage and current analog signals produced by the voltage and current responsive transducers. Examples of such electronic energy measuring circuits and devices are described in U.S. Pat. Nos. 3,343,084; 3,764,908; 3,864,631; and 4,077,061, all assigned to the assignee of this invention. Typically, the voltage and current responsive inputs to the AC electric energy measuring circuits are usually provided by instrument transformers producing analog signals proportional to the line voltage and line current components of the electric energy quantity to be measured. The electronic measuring circuits are operable at the small or low level signal magnitudes while the electric power line voltage and currents are several magnitudes larger. Therefore, it is generally required of the sensing transducers providing voltage and current responsive analog signals to the measuring circuits, that they have large transformation ratios. In the case of current sensing transducers the outputs must be linear over wide ranges of line current input values.

In typical electric energy measurements at an electric power utility customer location, sixty Hertz AC electric power is delivered at substantially constant line voltages of either one-hundred and twenty or two-hundred and forty volts defining the line voltage components of the electric energy quantity to be measured. On the other hand, line current, which defines the current component of the electric energy to be measured, varies considerably, typically in a desired linear measurement range from one-half ampere to two hundred amperes or in a current variation ratio of approximately one to four hundred. Accordingly, standard potential instrument transformer arangements often can provide ractical voltage sensing transducers. Current instrument transformers receiving the aforementioned wide current input variations and producing the low level signal outputs often require structural arrangements which are of substantial size and cost. When it is desired to manufacture electronic AC energy measuring circuits and devices which are relatively compact and comparable in cost to the aforementioned conventional induction type watthour meter, the voltage and current sensing transducers often present substantial contributions to the overall size and cost of such devices. As is known in accurate current instrument transformer transducers, the ampere turns of the primary and of the secondary must be equal, and since maximum current levels and the primary reach two hundred amperes, the primary and secondary winding sizes become substantial in order to produce linear low level signal outputs. Thus, the current transformer transducers become quite bulky and are relatively costly.

Another consideration in using inductive or transformer types of current transducers is the non-linearity of the magnetic materials used for magnetic cores in such transducers. Less expensive magnetic core materials tend to have decreased linearity characteristics so that the output signals therefrom are not consistently proportional over the wide ranges of sensed line currents. The linear response of current sensing transducers having a magnetic core and a primary winding carrying the line current to be sensed can be improved by the use a first or sensing secondary winding and a second or compensating winding which is used to oppose the flux in the core produced by the primary in resonse to the output of the sensing secondary winding. By maintaining the magnetic flux of the magnetic core near zero and compensating for virtually all of magnetic flux produced by the primary current, a more linear response is provided. One problem in this technique occurs when measuring large power line currents over wide dynamic ranges because the ampere turns of the primary winding must be matched by the ampere turns capability of the compensating secondary winding. If the compensating secondary winding is to develop current responsive analog signals for application to the inputs of electronic measuring circuits, with a typical low level signal current value in the order of five milliamperes, a single turn primary winding carrying a current value in the order of two hundred amperes would effect a magnetomotive force of two-hundred ampere-turns so that a compensating secondary winding would require approximately forty thousand winding turns to produce the required bucking ampere turns. Such a current sensing transducer would be of substantial size and cost.

in U.S. Pat. No. 2,428,613, a single turn primary current transformer is disclosed having a ring-shaped core, a first or sensing secondary winding having outputs applied to an amplifier with the amplifier having an output applying a controlled current to a compensating secondary winding so that the ampere turns produced by the compensating secondary winding balances the ampere turns produced by the single turn primary winding. While this device accomplishes the improvement of linear respose, the physical size and cost thereof are substantial for the reasons noted herinabove when the primary current reaches large power line current magnitudes and the output current resonsive analog signals are required to be of the low level signal character. In U.S. Pat. No. 3,539,908, an instrument type transformer arrangement is described for transforming both polarities of a unidirectional current rather than for producing low level current responsive analog signals in response to an AC power line current. A saturating core is described wherein a plurality of secondary windings are provided thereon with the ampere-turns of selected ones of the secondary windings being produced to oppose the ampere turns produced in the saturating core by a single turn primary winding. In British Specification No. 227,910 filed Oct. 23, 1923, a protective relaying device is disclosed having two magnetic cores sensing the current through the centers thereof provided by a power line current flow. Two current transformers are formed in which the current flowing from one through another will produce and the core of the another transformer a magnetic flux equal and opposite to that produced therein by the primary single turn winding thereof when the conditions of the power line circuit are normal. A protective relay circuit is energized when the flux in the other current transformer core becomes unbalanced due to a fault condition of the power line. This patent does not disclose a transformer having a compensating secondary winding for producing a current responsive analog signal proportional to a line current component.

Accordingly, it is desirable to provide a current sensing transducer which is highly reliable and accurate and having relativley simple mechanical and electrical configurations utilizing only a single magnetic core and a simple amplifier arrangement for generating a compensating current which also provides an output signal proportional to the line current being sensed. It is desired that the output signal from a current responsive analog signal which is proportional to the sensed line current over a range of current variation in the order of one to four hundred while having a linearly proportional response thereto by low level output signal values suitable as inputs to electronic current or energy measuring circuits.

SUMMARY OF THE INVENTION

In accordance with the present invention, a current sensing transducer for AC energy measuring circuits includes a conductive current divider having a branch path conducting fractional current which is proportional to a line current component of an electric energy quantity to be measured and producing the total current through the divider. A compensated transformer arrangement is included in the transducer having a magnetic core inductively coupled to the branch path so that it defines a single turn primary responsive to the fractional current. A first and sensing secondary winding and a second and compensating secondary winding of the transformer arrangement are connected to a magnetic flux balancing arrangement including an amplifier circuit connected between the first and second secondary windings to balance or virtually compensate the magnetic flux produced in the magnetic core by the fractional current and to provide a corresponding output signal that a current responsive analog signal linearly proportional to changes in the line current magnitudes.

It is a general feature of the present invention to provide a current sensing transducer having a compensated transformer arrangement and a conductive current divider providing a fractional current proportional to AC line current values being sensed. A further feature of the present invention is to provide a small and simple magnetic core having small and simply constructed sensing and compensating secondary windings effective to develop ampere turns in opposition to the ampere turns produced by the fractional current. It is a still further feature of this invention to provide a simple feedback amplifier arrangement receiving an input from the sensing secondary winding and producing an output for providing opposing and compensating core fluxes by precisely controlling the ampere turns produced by the compensating secondary winding with the amplifier output also providing a current responsive analog signal having low level signal characteristics linearly proportional to the line current.

Other features and advantages of the present invention will become apparent from the detailed description of the preferred embodiments shown in the drawings briefly described hereinafter.

DESCRIPTION OF THE PREFERRED EMBODIMENTS

Figure 1:
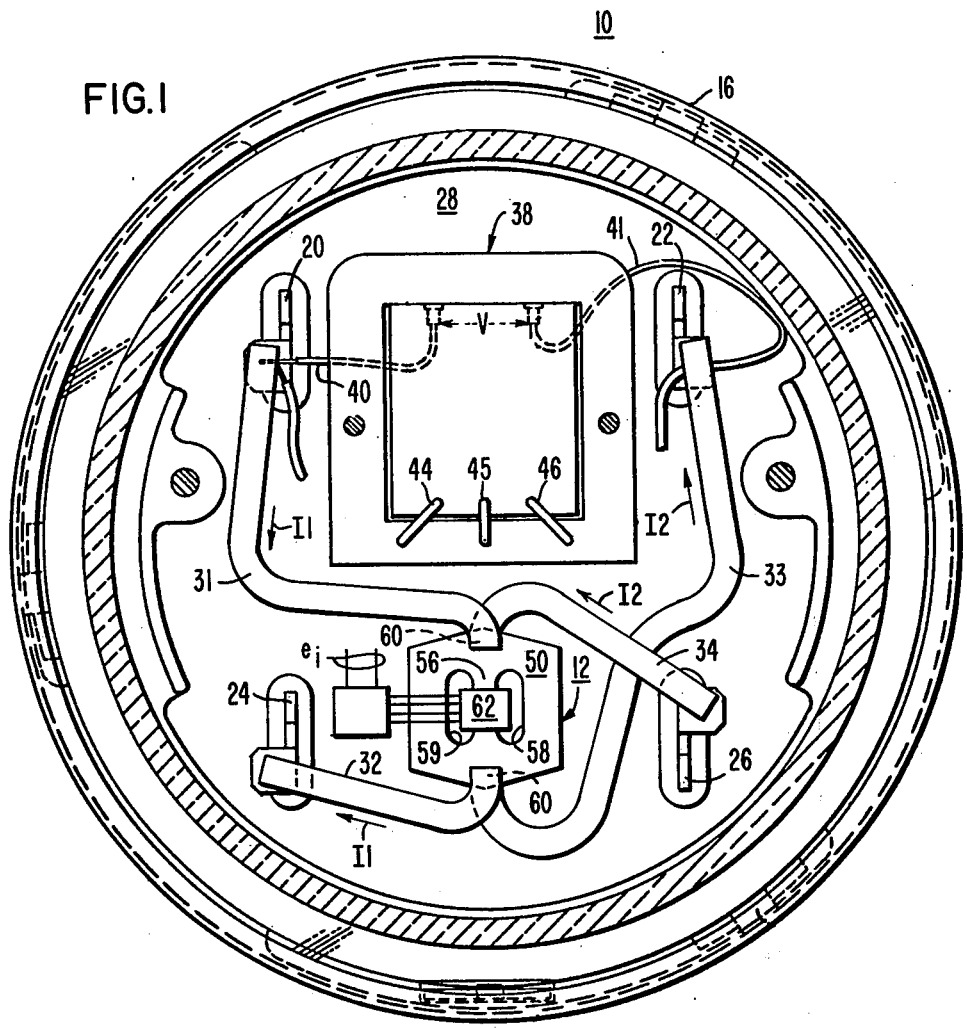
FIG. 1 is a front elevational view with parts broken away of an AC electric energy meter including a current sensing transducer meade in accordance with the present invention.

Referring now to the drawing and, more particularly to FIG. 1, an AC electric energy or watthour meter 10 is partially shown including a current sensing transducer 12 made in accordance with the present invention. The meter 10 is intended for use in one preferred embodiment with an AC electric energy measuring circuit for providing indications of the consumption of alternating current energy supplied to a customer location by an electric power producer for such purposes as billing of the customer for his electric power usage. Such electronic AC electric energy measuring circuits may include circuits described in the aforementioned U.S. Pat. Nos. 3,764,908; 3,864,631; and 4,077,061, all assigned to the assignee of this invention. The transducer 12 of this invention is intended to produce a current responsive analog signal $e_I$ which is proportional to variations in the line current component of electric energy to be measured by the measuring circuits.

The aforementioned measuring circuits are capable of producing pulse signals representative of quantized amounts of the electric energy being measured and such pulses are further utilized in a programmable time of day type of electronic metering circuit disclosed in U.S. Pat. application Ser. Nos. 891,996 and 891,997, filed Mar. 31, 1978, both assigned to the assignee of this invention. As disclosed in the aforementioned applications, time based electric energy measurements are indicated by an electronic numerical display or by corresponding electronic signals produced from data storage circuits provided therein.

The meter 10 is illustrated in one exemplary embodiment as it is, intended for connection between a sixty Hertz source of electric energy and an electric load, not shown, for measurement of the consumption of electrical energy by the load. As is well known, the electric energy to be measured is in kilowatt-hours defined by a line voltage V component and a line current I component. The meter 10 includes a housing 16 conventionally used for electromagnetic or induction type watthour meters in one preferred embodiment. Four meter blade terminals 20, 22, 24, and 26 carried in a conventional manner by a base 28 of the housing 16 are adapted for mounting at mating socket terminals, not shown, of a meter mounting box in a well known manner. A typical electric power service includes a three wire single phase connection having two hot conductors and one neutral conductor. The present invention is adaptable to a single hot wire conductor so that reference herein to line current is intended to include the two line current components of a three wire system or single line current component of a two wire system. The top blade terminals 20 and 22 are thus arranged to be connected in parallel to a pair of hot wire line conductors also not shown, having the line voltage V, typically 240 volts, sixty Hertz, thereacross with the line currents I1 and I2 passing in series with two power line conductors, also not shown. Thus, the line voltage V is developed across the blade terminals 20 and 22 and the line current passes in series through the pair of blade terminals 20 and 24 and then also in series with the pair of terminals 26 and 22 when the current sensing transducer 12 is connected within the meter 10 as described hereinafter.

Heavy current carrying conductors 31 and 32 are connected to the meter terminals 20 and 24, respectively, for connecting the transducer 12 in series therewith. Similarly, the heavy current carrying conductors 33 and 34 are connected to the terminals 22 and 26, respectively, for further connecting the transducer 12 in series with the terminals 22 and 26. Thus, the current sensing transducer 12 is connected in series with the two directions of the flow of line currents I1 and I2 in the conductors 31-32 and 33-34 being in the same direction through the transducer 12 as shown in FIG. 1. It is to be understood a total line current component I would be equal to I1 plus I2.

A voltage sensing transducer 38, not forming a part of this invention, is shown in FIG. 1 having a primary winding connected at primary wire leads 40 and 41 to the blade terminals 20 and 22. Thus, the line voltage V is applied across the primary of the voltage transducer 38. A center tapped secondary winding thereof has output wire leads 44, 45 and 46 providing an analog signal $e_v$ proportional to the line voltage V. The voltage sensing transducer 38 may be formed by an induction watthour meter voltage section as shown in FIG. 1. The analog signal $e_v$ provides one input for an AC energy measuring circuit producing energy computations from line voltage and current components. A second input to the measuring circuit is provided by the current sensing transducer 12 as described hereinafter.

Figure 3:
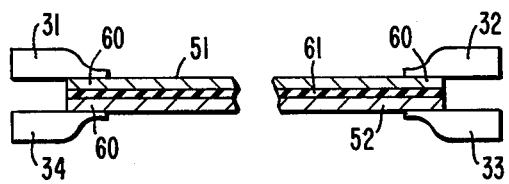
FIG. 3 is a side elevational view with parts broken away of terminal portions for the conductive current divider shown in FIG. 1.

The current sensing transducer 12 includes a two-part conductive current divider 50 wherein conductive members 52 and 53 thereof, shown in FIG. 3, have substantially identical sizes and configurations. The two conductive members 52 and 53 are formed of copper plate or sheet material and are electrically insulated from each other as shown in FIG. 3 and more fully described hereinbelow. The current conductors 31 and 32 are connected in series with the member 52 and the current conductors 33 and 34 are connected in series with the member 53. The connection of the current conductors is such that the two parallel paths of the line currents I1 and I2 are in the same direction through the conductive members 52 and 53. In one preferred form, the members 51 and 52 are each approximately one square centimeter in area in cross section and about five centimeters in length with insulation 61 therebetween.

The conductive current divider 50 provides a branch path 56 for conducting fractional current i therethrough which is proportional to the associated line current. The remaining portions of the divider 50 between the edges and the openings 58 and 59 provide a major current path. In the current sensing transducer 12, the branch path 56 is formed by a pair of equal and symmetrical hole openings 58 and 59 extending through both of the conductive members 52 and 53. The majority of the line current of each member flows, for example, in symmetrical and parallel paths between opposite ends 60 of the conductive current divider 50 from the conductors 31 and 34 around the outer portions of the members 52 and 53 to the lower portion of the divider 50 to flow out the conductors 32 and 34. The parallel branch path 56 is substantially smaller in area than the remaining portion of the members 52 and 53 and is centered between the side edges thereof so that a current splitting effect is produced and that a total fractional current i through the branch path 56 of each member is identically proportional to the flow of the total line current I. In one preferred embodiment the branch path of each member carries about two and one-half percent of the total current therethrough. The conductors 31, 32, 33 and 34 are connected at the opposite end terminals 60 at centers of the ends of members 51 and 52.

In FIG. 3 there is shown a side elevational view of the conductive current divider 50 with parts broken away showing the opposite terminal ends 60 of members 52 and 53 as they are connected to the meter current conductors 31, 32, 33 and 34. A layer 61 of insulation material electrically insulates the two members 52 and 53. The two members 52 and 53 are used because two line current paths are required for two hot wire conductors connected to the meter 10. A single conductive member may be used for signal hot wire system in accordance with this invention.

A compensated transformer arrangement 62 is mounted around the branch paths 56 so that it provides a single turn primary winding thereof. Thus the primary of the transformer arrangement 62 is inductively coupled and resonsive to the total fraction current i. The construction of the compensated transformer 62 is as described in connection with the FIG. 2 hereinbelow. Generally, a small magnetic core having a ring shape, although not limited thereto, carries a first and sensing secondary winding and a second and compensating secondary winding with the core being disposed in inductively coupled relationship around the branch path 56. The sensing and compensating secondary windings are connected to an amplifier circuit 65 also described further hereinbelow in connection with the description of the FIG. 2, with the output of the amplifier circuit 65 connected with an output providing a current responsive analog signal $e_i$ having a low level signal magnitude which is proportionally variable with variations with the total line current I. The analog signal $e_i$ provides a second input to an AC electric energy measuring circuit, not shown, as noted hereinabove.

Figure 2:
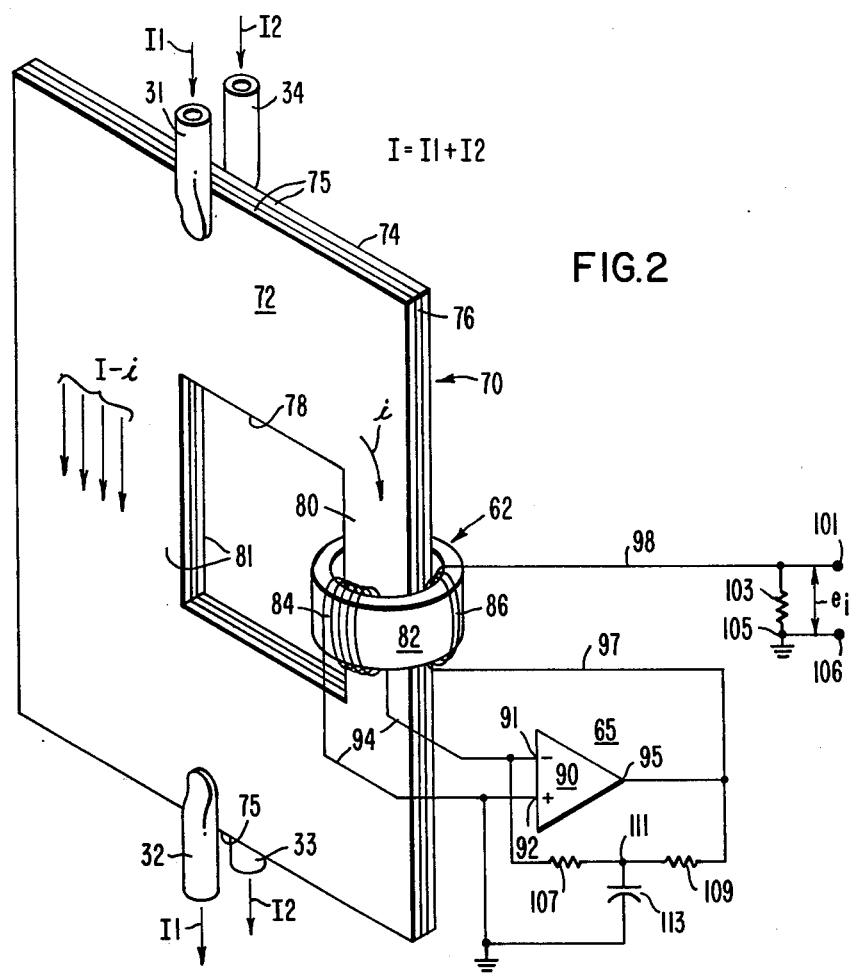
FIG. 2 is a perspective view of an alternative embodiment of a current sensing transducer including a conductive current divider and an electrical schematic diagram of an associated amplifier arrangement included therein.

Referring now to FIG. 2, there is shown an alternative embodiment of a current sensing transducer 70 showing the details of the transformer arrangement 62 and of the amplifier circuit 65 shown generally in FIG. 1. The conductive current divider 70 is formed by first and second conductive members 72 and 74 having an insulation layer 76 electrically insulating the two members. The layer 76 is similar to the insulation layer 61 separating the members 52 and 53 as shown in FIG. 3. The conductors 31 and 32 are connected to opposite terminal ends 75 of the conductive member 72 and the conductors 33 and 34 are connected to opposite terminal ends 75 of the conductive members 74 when the transducer 70 is used to replace the transducer 12 shown in FIG. 1. The current conductors are attached by suitable welding or soldering techniques also provided for the current divider 50 shown in FIGS. 2 and 3. The hole opening 78 extending through both members 72 and 74 defines a double branch path 80 corresponding to the branch path 56 in the transducer 12. Thus, the branch path 80 conducts a total fractional current i equal to a predetermined portion of the parallel current paths between opposite terminal ends 75 of each conductive member. A major current path 81 is provided by the portions of the members 72 and 74 opposite the opening 78 from the branch path 80.

The compensated transformer arrangement 62 is inductively coupled to the branch path 80, as it is branch path 56, so that the changes of the fractional alternating current i produce a flux which is sensed by a magnetic core 82 carrying a first and sensing secondary winding 84 and a second and compensating secondary winding 86. The secondary windings 84 and 86 are connected to the amplifier circuit 65 including an operational amplifier 90. The operational amplifier 90 may be provided by a type LM301A available from National Semiconductor Corp. The inverting and non-inverting inputs 91 and 92 to the operational amplifier 90 are connected, as shown, across the pair of output lead conductors 94 of the sensing secondary winding 84. The non-inverting input 92 of the amplifier 90 is also connected to a circuit reference ground potential at junction 93. The output 95 of the amplifier 90 is connected in series with the second or compensating secondary winding 86 so that one wire lead conductor 97 thereof is connected to the output 95. The other wire lead conductor 98 is connected to an output signal terminal 101 which is also connected to one end of a resistor 103. The other resistor end is connected to the reference ground potential at junction 105 which is also connected to a second output signal terminal 106. The amplifier 90 is connected with a negative feedback loop circuit such that the output 95 is connected through resistors 107 and 109 to the inverting input 91 of the amplifier 90. The junction 111 of the resistors 107 and 109 is connected through a capacitor 113 to the grounded circuit junction 93 and the non-inverting input 92 of the operational amplifier 90. This bypasses AC components from the output to the input of the amplifier 90 with the resistors 107 and 109 providing a closed DC feedback loop and open AC loop to the inverting amplifier input. The resistors 107 and 109 provide a low gain DC feedback loop to the amplifier input 91 for compensating the operation thereof.

The input of the operational amplifier 90 increases as the voltage induced in the sensing secondary winding 84 increases so that the input 95 of the amplifier 90 increases current flow to the compensating secondary winding 86 which tends to oppose and compensate the magnetic flux in the core 82 produced by the fractional current i. The output current from the amplifier output 95 "tracks" or correspondingly responds to the changes in the output voltage of the winding 84 due to changes in the core flux due to changes in the total fractional current i.

The operation of the magnetic core 82 which is, by way of example and not limitation, a strip wound type which is relatively small since the fraction current i is a small fraction of the total line current I, causes the flux of the compensating secondary winding 86 to effect virtual compensation of the flux produced in the core by the fractional current i. The flux level is kept near zero to produce a linear magnetic coupling response for the compensated transformer arrangement 62. The number of turns of the compensating secondary winding 86 and of the sensing winding secondary winding 84 includes the appropriate numbers to effect input control of the amplifier circuit 65 and opposing ampere-turns in the core 82 for compensating the flux produced by current i. A maximum in the order of five amperes of fractional current i is produced in response to two hundred amperes of line current I. A corresponding amplifier output current of five milliamperes is provided to winding 86.

The amount of current from the output 95 of amplifier 90 is sensed across the output resistor 103 so that the output terminals 101 and 106 provide the current responsive analog signal $e_i$ having variable voltage magnitudes. With the value of the resistor 103 being in the order of two thousand ohms, the voltage of signal $e_i$ across the terminals 101 and 106 has an upper value in the order of ten volts when the total line current I is at 200 amperes and the signal $e_i$ has a lower value in the order of 25 millivolts when the line current I is at one-half ampere in one exemplary embodiment. Thus, the signal $e_i$ provides an analog signal variable in amplitude and frequency in proportion to the line current I. Since the signal $e_i$ is representative of the input current I to the transducer 12, the signal $e_i$ is suitable for being applied to a current measuring device or current responsive input of an electric energy measuring circuit. A proportionality constant is to be taken into account in such devices and circuits to establish the ratio between the output voltage $e_i$ and the input current I of the transducer 12. In the arrangements shown in FIGS. 1 and 2 a ratio in the order of 0.05 volt per ampere is provided by the exemplary operation described.

Figure 4:
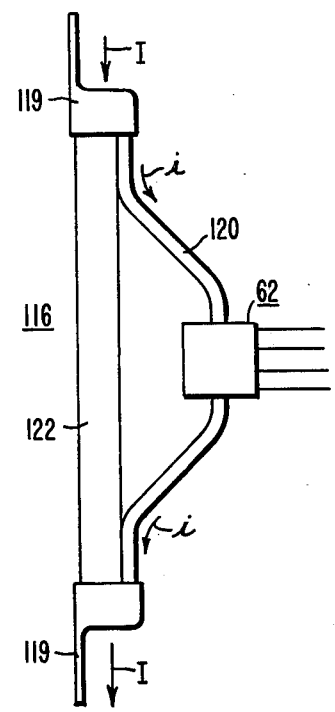
FIG. 4 is a perspective view of a further alternative embodiment of a conductive current divider made in accordance with the present inventon.
Figure 5:
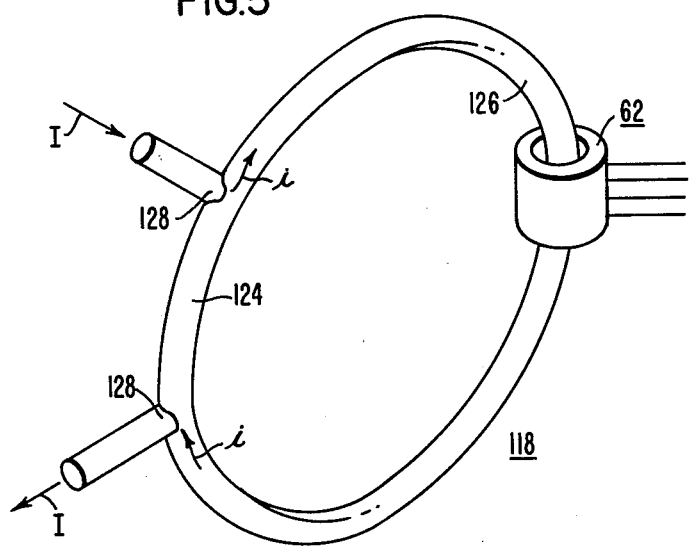
FIG. 5 is a perspective view of a still further alternative embodiment of a conductive current divider made in accordance with this invention.

FIGS. 4 and 5 illustrate alternative conductive current dividers 116 and 118. These are shown for a line current I passing through a single line conductor rather than two line conductors to be sensed. The current divider 116 is characterized by plural wire conductors between the opposite terminal ends 119 where a branch current path conductor 120 has a substantially smaller diameter than the major path provided by a larger diameter wire conductor 120. The lower conductivity and higher current carrying capacity of the conductor 120 may be replaced by a cable or bundle of wire conductors having an equivalent conductivity characteristic. A predetermined proportion or percentage of the input line current I is provided by the fractional current i due to the division of the I between the conductor 120 and conductor 122. The compensated transformer arrangement 62 is inductively coupled to the branch path conductor 120 for connection to the amplifier circuit 65 to produce the current responsive analog signal $e_i$ as described hereinabove.

In FIG. 5, the current divider 118 includes a major conductive path formed by a conductor 124 and a branch path formed by the conductor 126 extending between opposite end terminals 128 wherein the cross sectional areas of conductors 124 and 126 are identical with the lengths being unequal so that the conductor 126 is proportionally longer. Accordingly, a fractional current i is produced through the conductor 126 which is sensed by the compensated transformer 62. The compensated transformer arrangement 62 is mounted in inductive coupled relationship with the branch circuit 126 for operation in accordance with his invention as described hereinabove.

In summary of the operation of the current sensing transducer of this invention, a conductive current divider is connected in series with a line current I to be sensed. Symmetrical current flow through the divider includes parallel paths in which one branch path thereof provides a fractional current i proportional to the line current I. A compensated transformer arrangement 62 is inductively coupled to the branch path and an amplifier circuit 65 produces a controlled current to a compensating winding to oppose the flux produced by the fractional current. The amplifier output is then a measure of the line current applied to the transducer.

While preferred embodiments of the present invention have been described, other alternatives and modifications may be made as understood by those skilled in the art without departing from the spirit and scope of this invention.

We claim:

1. A current sensing transducer comprising: a conductive current divider having opposite terminal ends for series connection to a current component to be sensed, said current divider including two conductive members in mutually insulated relationship with each of said members having opposite terminal ends for separate series connection to two line currents defining said current component to be sensed, each of said conductive members further having a major current path and a branch current path for conducting a fractional current having a predetermined proportional value relative to one of said separate line currents; a compensated transformer including a magnetic core magnetically responsive to said fractional current of each branch current path so that each branch current path forms a primary winding thereof, and further including first and second secondary windings inductively coupled to said magnetic core; amplifier means including an input responsive to an output of said first secondary winding and further including an output connected to said second secondary winding so as to control current supplied to said second secondary winding for producing a compensating magnetic flux substantially opposing a flux induced into said magnetic core by each fractional current in response to line current flow through each of said two conductive members of said current divider; and output terminal means responsive to said current supplied to said second secondary winding for producing a current responsive analog signal representative of said current component to be sensed.

2. A current sensing transducer as claimed in claim 1 wherein each of said two conductive members of said conductive current divider includes a conductive plate having an opening through said plate member to form separated parallel paths between said opposite terminal ends for defining said major current path and said branch current path.

3. A current sensing transducer as claimed in claim 2 wherein two openings are formed in said conductive plate of each conductive member with three separated parallel paths being formed thereby substantially centered between side edges of plate member and the associated opposite terminal ends so that a center path defines said branch current path of each conductive member.

4. A current sensing transducer as claimed in claim 1 including a housing having four external terminals wherein first and third external terminals are connected to the opposite terminal ends of one conductive member and second and fourth external terminals are connected to the opposite terminal ends of the other conductive member, said first and said second external terminals also being connectable to receive a voltage component.

* * * * *